United States Patent
Li et al.

(10) Patent No.: US 9,930,808 B2
(45) Date of Patent: Mar. 27, 2018

(54) GRAPHENE-BASED THERMAL MANAGEMENT SYSTEMS

(71) Applicant: The Boeing Company, Seal Beach, CA (US)

(72) Inventors: Angela W. Li, Everett, WA (US); Jeffrey H. Hunt, Thousand Oaks, CA (US); Wayne R. Howe, Irvine, CA (US)

(73) Assignee: The Boeing Company, Chicago, IL (US)

( * ) Notice: Subject to any disclaimer, the term of this patent is extended or adjusted under 35 U.S.C. 154(b) by 532 days.

(21) Appl. No.: 14/202,451

(22) Filed: Mar. 10, 2014

(65) Prior Publication Data

US 2015/0257308 A1 Sep. 10, 2015

(51) Int. Cl.
*H05K 7/20* (2006.01)
*H01L 23/373* (2006.01)

(52) U.S. Cl.
CPC ....... *H05K 7/20427* (2013.01); *H01L 23/373* (2013.01); *H01L 2924/0002* (2013.01)

(58) Field of Classification Search
None
See application file for complete search history.

(56) References Cited

U.S. PATENT DOCUMENTS

| 8,263,843 | B2 | 9/2012 | Kim et al. |
| 2008/0248275 | A1 | 10/2008 | Jang et al. |

(Continued)

FOREIGN PATENT DOCUMENTS

| EP | 2 104 141 A2 | 9/2009 |
| EP | 2 269 948 A1 | 1/2011 |

(Continued)

OTHER PUBLICATIONS

Machine translaton JP 2013-157590 (2013).*

(Continued)

*Primary Examiner* — Alexandre F Ferre
(74) *Attorney, Agent, or Firm* — MH2 Technology Law Group LLP

(57) ABSTRACT

In one aspect, thermally managed electronic components are described herein. In some implementations, a thermally managed electronic component comprises an electronic component and a thermal management coating disposed on a surface of the electronic component. The thermal management coating comprises a graphene coating layer disposed on the surface of the component. The graphene coating layer may comprise a layer of aligned carbon nanoparticles. Moreover, the thermal management coating may further comprise an additional layer of aligned carbon nanoparticles disposed on the graphene coating layer. In another aspect, methods of applying a thermal management coating on an electronic component are disclosed. In some implementations, such a method comprises disposing a graphene coating layer on a surface of an electronic component. The graphene coating layer may comprise a layer of aligned carbon nanoparticles. Such a method may further comprise disposing an additional layer of aligned carbon nanoparticles on the graphene coating layer.

19 Claims, 2 Drawing Sheets

(56) References Cited

U.S. PATENT DOCUMENTS

| | | | |
|---|---|---|---|
| 2009/0213551 A1* | 8/2009 | Wyland | H01L 23/3128 361/708 |
| 2009/0237886 A1* | 9/2009 | Iwai | H01L 23/373 361/708 |
| 2011/0032678 A1 | 2/2011 | Altman et al. | |
| 2011/0049437 A1 | 3/2011 | Crain et al. | |
| 2011/0204020 A1 | 8/2011 | Johnstone et al. | |
| 2012/0282419 A1 | 11/2012 | Ahn et al. | |
| 2012/0298619 A1* | 11/2012 | Jiang | B82Y 30/00 216/20 |
| 2013/0000961 A1* | 1/2013 | Strachan | B82Y 30/00 174/257 |
| 2014/0212659 A1 | 7/2014 | Dai et al. | |

FOREIGN PATENT DOCUMENTS

| | | | |
|---|---|---|---|
| JP | 2008-205273 A | | 9/2008 |
| JP | 2012-212706 A | | 1/2012 |
| JP | 2013157590 A | * | 8/2013 |
| KR | 10-2013-0001705 A | | 1/2013 |
| WO | 2009069684 A1 | | 6/2009 |

OTHER PUBLICATIONS

Partial International Search Report for PCT/US2015/015630 dated Jun. 5, 2015.

International Search Report and Written Opinion for PCT/US2015/017043 dated Jun. 10, 2015.

Grace, Tom, "An Introduction to Carbon Nanotubes," Center on Polymer Interfaces and Macromolecular Assemblies, Jun. 26, 2003, XP055192255, CPIMA RET Program (retrived from the internet: URL:http://web.stanford.edu/group/cpima/education/nanotube_lesson.pdf [retrived on May 29, 2015]), pp. 6-10.

Sinclair, John, "An Introduction to Carbon Nanotubes," Mar. 24, 2009, XP055192250 (retrieved from the internet: URL:http://sces.phys.utk.edu/~dagotto/condensed/HW1_2009/Carbon_Nanotube_John_Sinclair.pdf (retrieved on May 29, 2015), Figures 1, 2.

Pop, Eric, et al., "Thermal properties of graphene: Fundamentals and applications," MRS Bulletin, vol. 37, No. 12, Nov. 23, 2012, pp. 1273-1281, XP055192279, ISSN: 0883-7694, DOI: 10.1557/mrs.2012.203, Figure 3, p. 6, paragraph 2.

Balandin et al., "Superior Thermal Conductivity of Single-Layer Graphene," Nano Letters, vol. 8, No. 3, 2008, pp. 902-907.

Bommel et al., "Leed and Auger Electron Observations of the SiC (0001) Surface," Surface Science 48, 1975, pp. 463-472.

Ishigami et al., "Crystal Plane Dependent Growth of Aligned Single-Walled Carbon Nanotubes on Sapphire," J. Am.. Chem. Soc. 2008, vol. 130, No. 30, pp. 9918-9924.

Li et al., "Heat Conduction Across Multiwalled Carbon Nanotube/Graphene Hybrid Films," 2011 13th Electronics Packaging Technology Conference, Copyright 2011, IEEE, pp. 63-66.

Peng et al., "Direct Growth of Bilayer Graphene on $SiO_2$ Substrates by Carbon Diffusion Through Nickel," ACS Nano 2011, vol. 5, No. 10, pp. 8241-8247.

Ren et al., "Synthesis of Large Arrays of Well-Aligned Carbon Nanotubes on Glass," Science vol. 282, Nov. 1998, pp. 1105-1107.

Vlassiouk et al., "Role of Hydrogen in Chemical Vapor Deposition Growth of Large Single-Crystal Graphene," ACS Nano 2011, vol. 5, No. 7, pp. 6069-6076.

Yan et al., "Growth of Bilayer Graphene on Insulating Substrates," ACS Nano 2011, vol. 5, No. 10, pp. 8187-8192.

Hermanson et al., "Dielectrophoretic Assembly of Electrically Functional Microwires from Nanoparticle Suspensions," Science, vol. 294 (2001), pp. 1082-1086.

\* cited by examiner

GRAPHENE-BASED THERMAL MANAGEMENT SYSTEMS

FIELD

This disclosure relates to systems and methods for conducting thermal energy away from electronic components and, in particular, to graphene-based heat sinks and thermal conduits.

BACKGROUND

Electronic components and electronic connections or connectors are generally sensitive to thermal stress. In addition, many electronic components or sub-elements of electronic components generate waste heat. As a result, it is often desirable to transport thermal energy away from the electronic components or connections or connectors in order to prevent temporary or permanent damage to the electronic components or connections or connectors due to thermal stress. Some previous methods use metal bases, such as copper bases, to absorb and conduct the thermal energy away from the electronic components. Unfortunately, such methods can require the use of metal bases that are heavy and/or bulky, adding excessive weight and/or taking up excessive volume. In many applications, such as aerospace applications, additional weight and volume are undesirable. Therefore, there exists a need for improved thermal management systems and methods for electronic components and electronic connections or connectors.

SUMMARY

In one aspect, thermally managed electronic components are described herein which, in some implementations, may provide one or more advantage over previous thermally managed electronic components. For example, in some implementations, a thermally managed electronic component described herein has decreased volume and/or mass compared to some other thermally managed electronic components. In addition, a thermally managed electronic component described herein can exhibit improved heat sinking and/or thermal conduit properties, such as an improved thermal conductance. Therefore, in some implementations, a thermally managed electronic component described herein can exhibit improved thermal transport characteristics without a substantial increase of the component's mass or volume. For reference purposes herein, an "electronic component" can refer collectively to electronic components and any electronic connectors or connections from, to, or between electronic components.

In some implementations, a thermally managed electronic component described herein comprises an electronic component and a thermal management coating disposed on a surface of the electronic component. In some cases, the thermally managed electronic component further comprises an insulating material layer disposed between the surface of the electronic component and the thermal management coating. The thermal management coating, in some implementations, comprises a graphene coating layer disposed on the surface of the electronic component. Further, in some instances, the graphene coating layer comprises a layer of aligned carbon nanoparticles. In addition, in some cases, the thermal management coating further comprises an additional layer of aligned carbon nanoparticles disposed on the graphene coating layer. The graphene coating layer, in some implementations, comprises one or more graphene sheets. In some implementations, the graphene coating layer comprises between 1 and 30 atomic layers. A layer of aligned carbon nanoparticles, in some implementations, comprises single-walled carbon nanotubes (SWNTs), multi-walled carbons nanotubes (MWNTs), fullerenes, heterofullerenes, or a combination thereof. Moreover, in some cases, the carbon nanoparticles can be arranged or configured in a symmetric or anti-symmetric configuration. In some instances, one or more layers of aligned carbon nanoparticles has a dextral or sinistral structure.

In another aspect, methods of applying a thermal management coating to an electronic component are described herein. In some implementations, a method of applying a thermal management coating to an electronic component comprises disposing a graphene coating layer on a surface of the electronic component. In some instances, the graphene coating layer comprises a layer of aligned carbon nanoparticles. Additionally, in some cases, the method further comprises disposing an additional layer of aligned carbon nanoparticles on the graphene coating layer. In some implementations, a layer of aligned carbon nanoparticles is deposited using a vapor deposition process, such as chemical vapor deposition (CVD). Moreover, in some cases, a method described herein further comprises depositing a catalyst film or layer of catalyst particles on the graphene coating layer prior to disposing the layer of aligned carbon nanoparticles. Further, in some implementations, an electric field and/or magnetic field is applied to the electronic component during growth of the layer of aligned carbon nanoparticles. In addition, in some cases, a method described herein further comprises disposing an electrically insulating material layer on the surface of the electronic component prior to disposing the thermal management coating on the surface of the electronic component.

These and other implementations are described in greater detail in the detailed description which follows.

DETAILED DESCRIPTION

Figure 1:
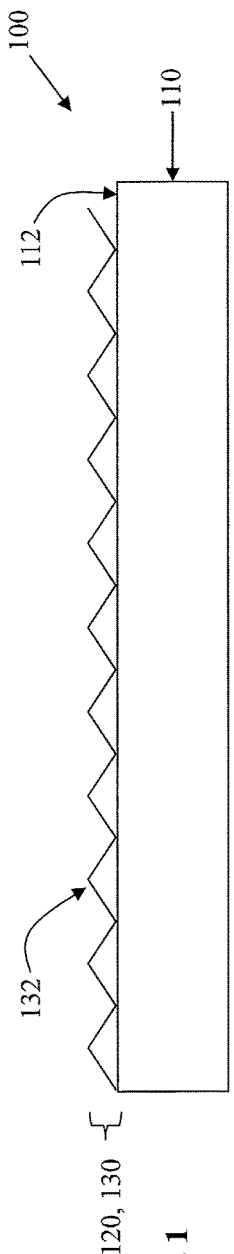
FIG. 1 illustrates schematically a side view of a thermally managed electronic component according to one implementation described herein.

Implementations described herein can be understood more readily by reference to the following detailed description, examples, and drawings. Elements, apparatus, and methods described herein, however, are not limited to the specific implementations presented in the detailed description, examples, and drawings. It should be recognized that these implementations are merely illustrative of the principles of the present disclosure. Numerous modifications and adaptations will be readily apparent to those of skill in the art without departing from the spirit and scope of the disclosure.

In addition, all ranges disclosed herein are to be understood to encompass any and all subranges subsumed therein.

For example, a stated range of "1.0 to 10.0" should be considered to include any and all subranges beginning with a minimum value of 1.0 or more and ending with a maximum value of 10.0 or less, e.g., 1.0 to 5.3, or 4.7 to 10.0, or 3.6 to 7.9.

All ranges disclosed herein are also to be considered to include the end points of the range, unless expressly stated otherwise. For example, a range of "between 5 and 10" should generally be considered to include the end points 5 and 10.

Further, when the phrase "up to" is used in connection with an amount or quantity, it is to be understood that the amount is at least a detectable amount or quantity. For example, a material present in an amount "up to" a specified amount can be present from a detectable amount and up to and including the specified amount.

I. Thermally Managed Electronic Components

In one aspect, thermally managed electronic components are described herein. In some implementations, a thermally managed electronic component comprises an electronic component and a thermal management coating disposed on a surface of the electronic component. In some cases, the thermally managed electronic component further comprises an insulating material layer disposed between the surface of the electronic component and the thermal management coating. The electrically insulating material layer of a thermally managed electronic component, in some implementations, can be used to prevent electrical contact between the thermal management coating and an exposed electrically conductive material on the surface of the electronic component. The thermal management coating of a thermally managed electronic component described herein comprises a graphene coating layer disposed on the surface of the electronic component. In some cases, the graphene coating layer comprises a layer of oriented or aligned carbon nanoparticles. In addition, in some cases, the thermal management coating layer further comprises an additional layer of oriented or aligned carbon nanoparticles disposed on the graphene coating layer.

Turning now to specific components of thermally managed electronic components, a thermally managed electronic component described herein comprises a thermal management coating comprising a graphene coating layer disposed on a surface of the electronic component. Any graphene coating layer not inconsistent with the objectives of the present disclosure may be used. For reference purposes herein, a "graphene" coating layer includes $sp^2$-bonded carbon as a primary carbon component, as opposed to $sp^a$-bonded carbon. In some implementations, a graphene coating layer described herein comprises no $sp^3$-hybridized carbon or substantially no $sp^3$-hybridized carbon. For example, in some implementations, a graphene coating layer comprises less than about 10 atom percent or less than about 5 atom percent $sp^3$-hybridized carbon, relative to the total amount of carbon in the graphene coating layer. In some implementations, a graphene coating layer comprises less than about 2 atom percent or less than about 1 atom percent $sp^3$-hybridized carbon. Moreover, a graphene coating layer described herein, in some implementations, does not comprise, consist, or consist essentially of diamond-like carbon (DLC).

In some implementations, a graphene coating layer comprises, consists, or consists essentially of one or more graphene sheets. A graphene sheet, in some implementations, comprises a single molecular or atomic layer having a flat planar structure. Any number of graphene sheets not inconsistent with objectives of the present disclosure may be used. In some implementations, a graphene coating layer comprises a plurality of graphene sheets. The plurality of graphene sheets, in some implementations, can be arranged in a stacked or layered configuration. In other implementations, a graphene coating layer comprises or consists of a single graphene sheet. Therefore, in some implementations, a graphene coating layer described herein comprises 1 or more atomic layers of graphene. In some implementations, a graphene coating layer comprises between 1 and 30 atomic layers of graphene. In some implementations, a graphene coating layer comprises between 1 and 20 atomic layers or between 1 and 10 atomic layers of graphene. In some implementations, a graphene coating layer comprises 1 atomic layer of graphene.

FIG. 1 illustrates a side view of a thermally managed electronic component comprising a thermal management coating comprising a graphene coating layer comprising a graphene sheet. As understood by one of ordinary skill in the art, the various elements depicted in FIG. 1 are representational only and are not necessarily drawn to scale. In the implementation of FIG. 1, a thermally managed electronic component (100) comprises an electronic component (110) and a thermal management coating (120) disposed on a surface (112) of the electronic component (110). Thermal management coating (120) comprises a graphene coating layer (130) comprising graphene sheet (132). Graphene sheet (132) is depicted schematically in FIG. 1 by a line resembling an alkane chain. However, as understood by one of ordinary skill in the art, such a depiction is for illustration purposes only. In addition, electronic component (110) is depicted schematically in FIG. 1 as having a rectangular cross section and a flat planar surface. However, other implementations are also possible. For example, in some implementations, an electronic component can have a circular, elliptical, or other cross sectional shape. Any size and shape not inconsistent with the objectives of the present disclosure may be used. Similarly, in some implementations, the surface (112) of the electronic component (110) can have a curvature, including a convex curvature, a concave curvature, or a periodic or undulating curvature. In some implementations, the surface (112) of the electronic component (110) may comprise an electronic component such as a transformer, resistor, capacitor, inductor, integrated circuit, and/or other electronic component. In some implementations, the surface (112) of the electronic component (110) may have one or more electronic subcomponents disposed thereon, creating a textured or irregular surface. For example, in some cases, one or more transformers, resistors, capacitors and/or inductors are disposed on the surface (112), and the graphene sheet (132) is disposed over the subcomponents. In addition, in some cases, an intermediary electrically insulating material layer (not shown) may be disposed between the surface (112), including one or more electronic subcomponents that may be disposed on the surface (112), and the thermal management coating (120).

In other implementations, a graphene coating layer described herein comprises, consists, or consists essentially of a layer of graphene tubes. Any graphene tubes not inconsistent with the objectives of the present disclosure may be used. In some implementations, graphene tubes comprise carbon nanotubes (CNTs) such as single-walled carbon nanotubes (SWNTs) or multi-walled carbon nanotubes (MWNTs).

Moreover, graphene tubes can have any size not inconsistent with the objectives of the present disclosure. For example, in some implementations, graphene tubes have a size in at least one dimension of less than about 500 nm, less than about 300 nm, or less than about 100 nm. In some implementations, graphene tubes have a size in at least one dimension between about 1 nm and about 200 nm, between about 1 nm and about 150 nm, or between about 5 nm and about 100 nm. In some implementations, graphene tubes have a size in at least one dimension between about 5 nm and about 75 nm or between about 15 nm and about 60 nm. In some implementations, graphene tubes have a size in at least one dimension between about 20 nm and about 30 nm or between about 45 nm and about 55 nm. In some implementations, graphene tubes have a size in at least two dimensions of less than about 300 nm or less than about 100 nm. In some implementations, graphene tubes have a size in at least two dimensions between about 1 nm and about 200 nm, between about 1 nm and about 150 nm, or between about 5 nm and about 100 nm. In some implementations, graphene tubes have a size in at least two dimensions between about 5 nm and about 75 nm or between about 15 nm and about 60 nm.

Moreover, in some implementations, graphene tubes of a graphene coating layer have a low aspect ratio. In some implementations, graphene tubes have an aspect ratio of about 20 or less or about 10 or less. In some implementations, graphene tubes have an aspect ratio between about 2 and about 15 or between about 3 and about 10. In addition, graphene tubes having an aspect ratio of about 20 or less, in some implementations, have a length ranging from about 5 nm to about 200 nm or from about 10 nm to about 100 nm.

Further, the graphene tubes of a graphene coating layer described herein, in some implementations, can be oriented or aligned in the layer. In some implementations, one or more graphene tubes can be oriented horizontally or substantially horizontally in the layer. In other implementations, one or more graphene tubes can be oriented vertically or substantially vertically in the layer. Moreover, in some implementations, vertically or substantially vertically oriented graphene tubes in a layer are aligned or substantially aligned with one another, including in an array.

Figure 2:
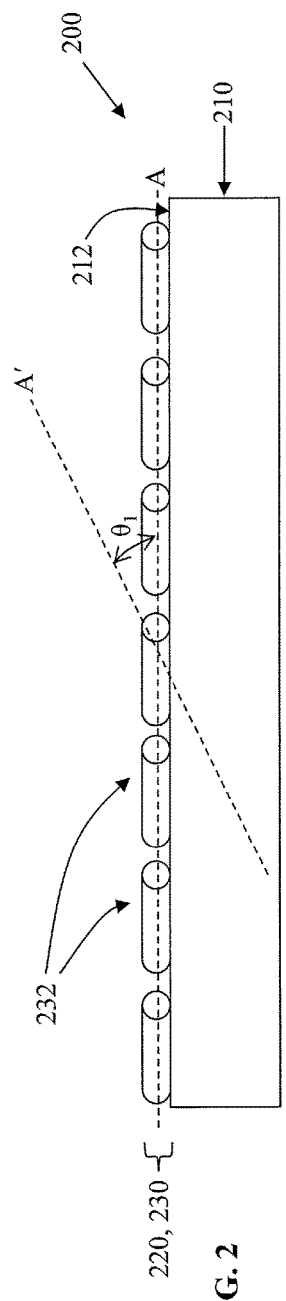
FIG. 2 illustrates schematically a side view of a thermally managed electronic component according to one implementation described herein.
Figure 3:
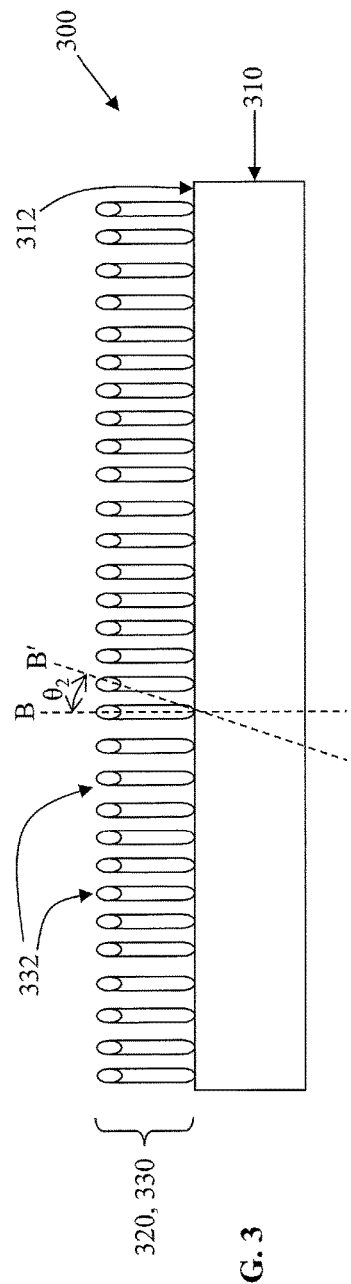
FIG. 3 illustrates schematically a side view of a thermally managed electronic component according to one implementation described herein.

FIGS. 2 and 3 each illustrate a thermal management coating comprising graphene coating layer comprising a layer of graphene tubes according to some implementations described herein. With reference to FIG. 2, a thermally managed electronic component (200) comprises an electronic component (210) and a thermal management coating (220) comprising a graphene coating layer (230) disposed on a surface (212) of the electronic component (210). Further, in some cases, an intermediary electrically insulating layer (not shown) can be positioned between the surface (212) and the graphene coating layer (230). In the implementation of FIG. 2, the graphene coating layer (230) of the thermally managed electronic component (200) comprises a plurality of graphene tubes (232) oriented horizontally or substantially horizontally on the surface (212) of the electronic component (210). Horizontal orientation is relative to the surface (212). For reference purposes herein, a "horizontal" orientation comprises an orientation wherein the long axis of a graphene tube (232) is oriented parallel to the surface (212). In the implementation of FIG. 2, all of the graphene tubes (232) are depicted as having a long axis oriented parallel to the surface (212). However, other arrangements are possible. For example, in some implementations, one or more graphene tubes can have a long axis along line A' in FIG. 2 or along some other direction that is not parallel to the surface (212). For reference purposes herein, a "substantially horizontal" orientation comprises an orientation wherein the long axis (A') of a graphene tube forms an angle ($\theta_1$) of less than about 45 degrees with a line (A) parallel to the surface (212) of the electronic component (210). In some implementations, the angle ($\theta_1$) is less than about 30 degrees or less than about 15 degrees. In some implementations, the angle ($\theta_1$) is between about 0 degrees and about 30 degrees. In some implementations, a majority of the graphene tubes of a graphene coating layer described herein have a horizontal or substantially horizontal orientation. Further, in some implementations, at least about 60 percent, at least about 70 percent, at least about 80 percent, or at least about 90 percent of the graphene tubes of a graphene coating layer have a horizontal or substantially horizontal orientation.

In other implementations, the graphene tubes of a graphene coating layer can be oriented vertically or substantially vertically. For example, with reference to FIG. 3, a thermally managed electronic component (300) comprises an electronic component (310) and a thermal management coating (320) comprising a graphene coating layer (330) disposed on a surface (312) of the electronic component (310). Further, in some cases, an intermediary insulating layer (not shown) can be positioned between the surface (312) and the graphene coating layer (330). In the implementation of FIG. 3, the graphene coating layer (330) of thermally managed electronic component (300) comprises a plurality of graphene tubes (332) oriented vertically or substantially vertically on the surface (312) of the electronic component (310). Vertical orientation is relative to the surface (312). For reference purposes herein, a "vertical orientation" comprises an orientation wherein the long axis of a graphene tube (332) is oriented perpendicular to the surface (312). In the implementation of FIG. 3, all of the graphene tubes (332) are depicted as having a long axis oriented perpendicular to the surface (312). However, other arrangements are possible. For example, in some implementations, one or more graphene tubes can have a long axis along line B' in FIG. 3 or along some other direction that is not parallel to the surface (312). A "substantially vertical" orientation, for reference purposes herein, comprises an orientation wherein the long axis (B') of a graphene tube forms an angle ($\theta_2$) of less than about 45 degrees with a line (B) perpendicular to the surface of the electronic component. In some implementations, the angle ($\theta_2$) is less than about 30 degrees or less than about 15 degrees. In some implementations, the angle ($\theta_2$) is between about 0 degrees and about 30 degrees. In some implementations, a majority of the graphene tubes of a graphene coating layer described herein have a vertical or substantially vertical orientation. Further, in some implementations described herein, at least about 60 percent, at least about 70 percent, at least about 80 percent, or at least about 90 percent of the graphene tubes of a graphene coating layer have a vertical or substantially vertical orientation.

In addition, in some implementations, a graphene coating layer described herein comprises, consists, or consists essentially of a monolayer of graphene tubes, including a monolayer of horizontally or substantially horizontally oriented graphene tubes or a monolayer of vertically or substantially vertically oriented graphene tubes.

Moreover, a graphene coating layer described herein can have any thickness not inconsistent with the objectives of the present disclosure. In some implementations, for example, a graphene coating layer has an average thickness of about 500 nm or less, about 300 nm or less, or about 200 nm or less. In some implementations, a graphene coating layer has an average thickness of about 100 nm or less. In some implementations, a graphene coating layer has an average thickness of about 50 nm or less, about 10 nm or less, or about 5 nm or less. In some implementations, a graphene coating layer has an average thickness of about 3 nm or less, about 2 nm or less, or about 1 nm or less. For example, in some implementations, a graphene coating layer described herein may have an average thickness between about 1 nm and about 300 nm, between about 1 nm and about 200 nm, between about 1 nm and about 100 nm, between about 10 nm and about 300 nm, between about 10 nm and about 200 nm, or between about 10 nm and about 100 nm. Further, in some implementations, a graphene coating layer may have an average thickness between about 50 nm and about 300 nm, between about 50 nm and about 200 nm, between about 50 nm and about 100 nm, or between about 100 nm and about 300 nm. In some implementations, a graphene coating layer may have an average thickness greater than about 100 nm or greater than about 300 nm.

Further, in some implementations wherein a graphene coating layer described herein comprises a layer of graphene tubes, the average thickness of the graphene coating layer is no greater than about 50 times the average diameter of the graphene tubes. In some implementations, the average thickness of the graphene coating layer is no greater than about 20 times or no greater than about 10 times the average diameter of the graphene tubes. In some implementations, the average thickness of the graphene coating layer is no greater than about 5 times, no greater than about 3 times, or no greater than about 2 times the average diameter of the graphene tubes. In other implementations, the average thickness of the graphene coating layer is no greater than about 3 times the average length of the graphene tubes. In some implementations, the average thickness of the graphene coating layer is no greater than about 2 times, no greater than about 1.5 times, or no greater than about 1 times the average length of the graphene tubes.

In some implementations, a graphene coating layer described herein comprises or is formed from a plurality of graphene platelets connected by micro-wires. In some implementations, a plurality of graphene platelets can be disposed on a surface of the electronic component, and the plurality of graphene platelets can be connected by one or more micro-wires. In some implementations, graphene platelets can be pre-fabricated separately from the electronic component and subsequently disposed upon a surface of an electronic component for subsequent connection by micro-wires. In addition, graphene platelets can have any size or shape not inconsistent with the objectives of the present disclosure. For example, in some cases, the graphene platelets have a width or diameter of about 1 µm to about 2000 µm. In some implementations, graphene platelets have a width or diameter of between about 50 µm and about 1800 µm, between about 200 µm and about 1500 µm, or between about 400 µm and about 1200 µm. Further, in some implementations, graphene platelets have a width or diameter of between about 1 µm and about 1500 µm, between about 500 µm and about 1300 µm, between about 1000 µm and about 2000 µm, or between about 50 µm and about 1000 µm.

Additionally, micro-wires of a graphene coating layer described herein can be formed from any material not inconsistent with the objectives of the present disclosure. For example, in some implementations, micro-wires are formed from metallic nanoparticles such as gold nanoparticles, polymer microspheres, and/or combinations thereof. In some implementations, micro-wires can be formed from mixed suspensions of gold and sub-micron sized polystyrene latex microspheres. Further, micro-wires can have any size or shape not inconsistent with the objectives of the present disclosure. For example, in some implementations, micro-wires have a diameter between about 1 nm and about 100 nm, between about 10 nm and about 40 nm, or between about 15 nm and about 50 nm. In some implementations, micro-wires have diameters between about 1 nm and about 30 nm, between about 15 nm and about 30 nm, or between about 15 nm and about 100 nm. Further, in some implementations, micro-wires have a length between about 15 nm and 5 cm, between about 100 nm and about 5 cm, between about 500 nm and about 5 cm, between about 1 µm and about 5 cm, or between about 1 mm and about 5 cm. In some implementations, micro-wires have a length between about 15 nm and about 1 cm, between about 500 nm and about 1 cm, between about 1 cm and about 5 cm, between about 1 µm and about 1 cm, between about 1 mm and about 1 cm, or between about 5 mm and about 3 cm. Formation, deposition, and/or placement of micro-wires can be carried out in any manner not inconsistent with the objectives of the present disclosure. In some implementations, for instance, micro-wires may be formed by a dielectrophoretic assembly process, as described further hereinbelow.

In addition, the graphene coating layer of a thermal management coating described herein is disposed on a surface of an electronic component. In some implementations, the graphene coating layer is disposed directly on the surface of the electronic component. In other instances, the graphene coating layer is disposed on an electrically insulating material layer disposed between the graphene coating layer and the surface of the electronic component. Moreover, in some implementations, the graphene coating layer is bonded or adhered to the electrically insulating material layer or to surface of the electronic component. The bonding, in some implementations, comprises chemical bonding. In some implementations, bonding comprises physical bonding. Bonding, in some implementations, comprises or consists of one or more of covalent bonding, ionic bonding, hydrogen bonding, electrostatic interactions, and van der Waals interactions. In some implementations, for instance, bonding comprises or consists of van der Waals interactions. In some implementations, a graphene coating layer described herein is bonded or adhered to an electrically insulating material layer or a surface of an electronic component with an adhesion energy of at least about 75 mJ/m$^2$ or at least about 100 mJ/m$^2$, when measured by scanning electron microscopy (SEM) according to the method of Zong et al., "Direct measurement of graphene adhesion on silicon surface by intercalation of nanoparticles," *J. Appl. Phys.*, volume 107, page 026104-1 to 026104-3 (2007). Specifically, the adhesion energy (γ) is given by equation (1):

$$\gamma = \lambda E h (w/a)^4 \qquad (1),$$

where λ is a geometrical factor equal to 1/16, E is 0.5 TPa, h is the thickness of the graphene coating layer, w is a central blister displacement equal to the diameter of an intercalated nanoparticle, and a is a blister radius measured by SEM. The blister is provided by disposing a so-called wedge particle or intercalated nanoparticle between the coating layer and the substrate, as taught by Zong et al. The wedge particle can comprise any suitable particle not inconsistent with the objectives of the present disclosure. In some implementations, for instance, the wedge particle comprises a gold or silver nanoparticle having a diameter between about 10 nm and about 100 nm, the wedge particle being disposed between the electronic component and the coating layer for measurement purposes. In some implementations, a graphene coating layer is bonded or adhered to an electrically insulating material layer or a surface of an electronic component with an adhesion energy of at least about 150 mJ/m$^2$ when measured as described herein. In some implementations, a graphene coating layer is bonded or adhered to an electrically insulating material layer or a surface of an electronic component with an adhesion energy between about 50 mJ/m$^2$ and about 300 mJ/m$^2$ or between about 100 mJ/m$^2$ and about 200 mJ/m$^2$. In some implementations, a graphene coating layer described herein resists delamination or other detachment from the electronic component over time, including when exposed to adverse environmental conditions, such as extreme temperatures, high humidity, dust, or electromagnetic radiation exposure, or when exposed to variations or cycles of exposure to such conditions. Further, in some implementations, a graphene coating layer described herein is continuous or substantially continuous across the entire surface of the electronic component.

A thermal management coating of a thermally managed electronic component described herein, in some implementations, further comprises a layer of oriented or aligned carbon nanoparticles disposed on the graphene coating layer. Any carbon nanoparticles not inconsistent with the objectives of the present disclosure may be used. For example, in some cases, the carbon nanoparticles of an aligned nanoparticle layer described herein comprise anisotropic or elongated carbon nanoparticles, such as SWNTs or MWNTs. In some instances, carbon nanoparticles of an aligned nanoparticle layer comprise graphene nanotubes having the features described hereinabove for graphene coating layers.

Additionally, in some implementations, carbon nanotubes of an aligned nanoparticle layer have a symmetric structure. In other cases, the carbon nanotubes have an anti-symmetric structure. A carbon nanotube having a "symmetric" structure, for reference purposes herein, exhibits rotational, mirror plane, and/or glide plane symmetry. As understood by one of ordinary skill in the art, rotational symmetry generally refers to symmetry present in 180 degree rotation around an axis parallel to nanomaterial growth direction (such as $C_{2v}$ symmetry). Mirror plane symmetry generally refers to reflection across a plane which lies perpendicular to nanomaterial growth direction. Glide plane symmetry generally refers to reflection across a plane which lies perpendicular to nanomaterial growth direction, followed by translation parallel with the reflection plane. In some implementations, symmetric carbon nanotubes described herein display two or more of rotational, mirror plane, and/or glide plane symmetry. Similarly, a carbon nanotube having an "anti-symmetric" structure, for reference purposes herein, exhibits a relatively low degree of rotational, mirror plane, and/or glide plane symmetry. In some cases, anti-symmetric carbon nanotubes described herein exhibit none of or only one of rotational, mirror plane, and/or glide plane symmetry.

Further, carbon nanotubes of an aligned nanoparticle layer can also have a dextral or sinistral structure. A carbon nanotube having a "dextral" structure, for reference purposes herein, comprises a nanotube having right-handed chirality. Similarly, a carbon nanotube having a "sinistral" structure, for reference purposes herein, comprises a nanotube having left-handed chirality.

In addition, a layer of "aligned" carbon nanoparticles, for reference purposes herein, comprises a layer wherein all or substantially all of the carbon nanoparticles have the same or substantially the same orientation within the layer. The orientation can be relative to a long axis of the carbon nanoparticles, such as a long axis of carbon nanotubes. For example, in some cases, the aligned carbon nanoparticles comprise graphene nanotubes or carbon nanotubes, and all or substantially all of the carbon nanotubes have a vertical or substantially vertical orientation, as described hereinabove for the graphene nanotubes of a graphene coating layer. Such a vertical or substantially vertical arrangement of carbon nanotubes within an aligned nanoparticle layer, in some implementations, can be particularly useful when the underlying graphene coating layer comprises or is formed from one or more graphene sheets. In other instances, all or substantially all of the carbon nanotubes of an aligned nanoparticle layer have a horizontal or substantially horizontal orientation. In some implementations, all or substantially all of the carbon nanotubes have an orientation that is in between a horizontal orientation and a vertical orientation, such as an orientation of about 45 to 55 degrees relative to the surface of the electronic component. Moreover, in some cases, the standard deviation of the orientation of the carbon nanoparticles (in terms of degrees relative to the surface of the electronic component) is no greater than about 15 degrees, no greater than about 10 degrees, or no greater than about 5 degrees. Further, in some implementations, a majority of the carbon nanotubes tubes of an aligned layer described herein have an orientation described herein, such as a substantially vertical orientation. Additionally, in some implementations, at least about 60 percent, at least about 70 percent, at least about 80 percent, or at least about 90 percent of the carbon nanotubes of an aligned layer have an orientation described herein.

A layer of aligned nanoparticles described herein, in some cases, can also have a symmetric, anti-symmetric, dextral, or sinistral structure. In such a layer, for reference purposes here, a majority of the carbon nanoparticles exhibit the recited structure. For example, in a symmetric layer of aligned nanoparticles, a majority of the aligned nanoparticles have a symmetric structure as described hereinabove. Similarly, in a layer of aligned nanoparticles having a dextral structure, a majority of the aligned nanoparticles have a dextral structure as described hereinabove. Additionally, in some implementations of a layer having a symmetric, anti-symmetric, dextral, or sinistral structure, at least about 60 percent, at least about 70 percent, at least about 80 percent, or at least about 90 percent of the carbon nanoparticles of the layer have a symmetric, anti-symmetric, dextral, or sinistral structure.

Figure 4:
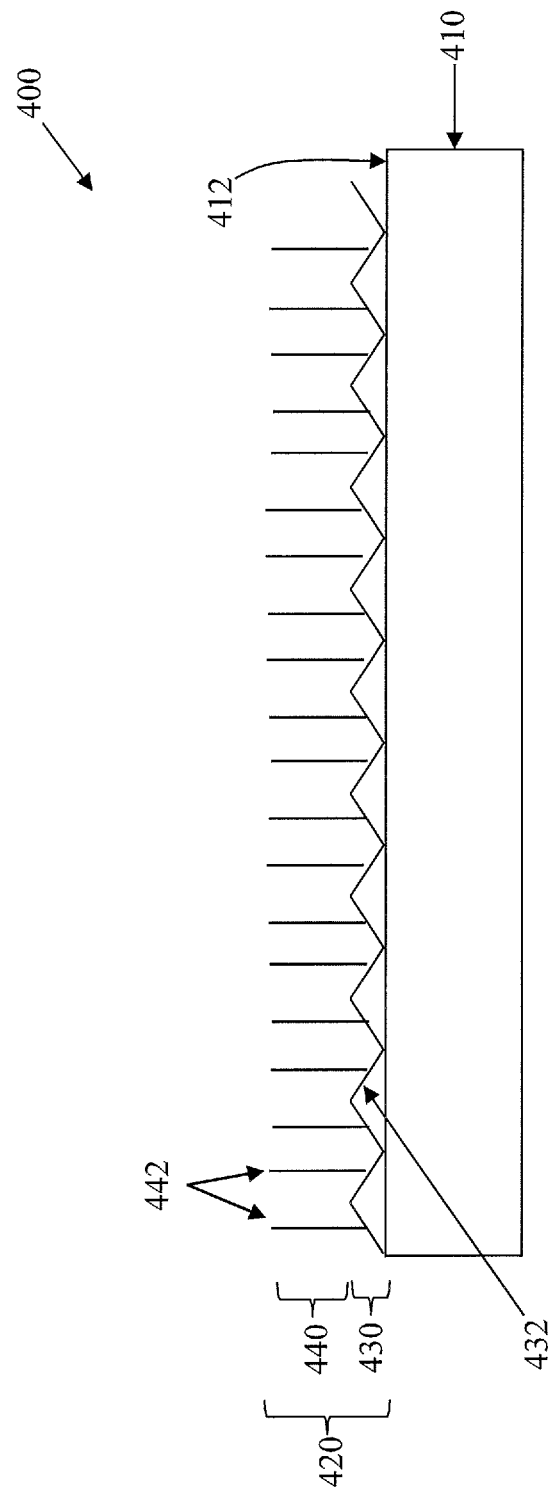
FIG. 4 illustrates schematically a side view of a thermally managed electronic component according to one implementation described herein.

FIG. 4 illustrates a side view of a thermally managed electronic component comprising an electronic component and a thermal management coating comprising a graphene coating layer and a layer of aligned carbon nanoparticles disposed on the graphene coating layer. As understood by one of ordinary skill in the art, the various elements depicted in FIG. 4 are representational only and are not necessarily drawn to scale. In the implementation of FIG. 4, a thermally managed electronic component (400) comprises an electronic component (410) and a thermal management coating (420). The thermal management coating (420) comprises a graphene coating layer (430) disposed on a surface (412) of the electronic component (410). Further, in some cases, an intermediary electrically insulating layer (not shown) can be positioned between the surface (412) and the graphene coating layer (430). As illustrated in FIG. 4, a layer of aligned carbon nanoparticles (440) is disposed on the graphene coating layer (430). Graphene coating layer (430) comprises a graphene sheet (432). The layer of aligned carbon nanoparticles (440) comprises an array of vertically oriented carbon nanotubes (442). The carbon nanotubes (442) are depicted schematically as vertically extending lines.

A layer of aligned carbon nanoparticles described herein can have any thickness not inconsistent with the objectives of the present disclosure. In some implementations, for example, a layer of aligned carbon nanoparticles has an average thickness of about 500 nm or less, about 300 nm or less or about 200 nm or less. In some implementations, a layer of aligned carbon nanoparticles has an average thickness of about 100 nm or less or about 50 nm or less. In some cases, a layer of aligned carbon nanoparticles described herein may have an average thickness between about 1 nm and about 300 nm, between about 1 nm and about 200 nm, between about 1 nm and about 100 nm, between about 10 nm and about 300 nm, between about 10 nm and about 200 nm, or between about 10 nm and about 100 nm. Further, in some implementations, a layer of aligned carbon nanoparticles may have an average thickness between about 50 nm and about 300 nm, between about 50 nm and about 200 nm, between about 50 nm and about 100 nm, or between about 100 nm and about 300 nm. In some implementations, a layer of aligned carbon nanoparticles may have an average thickness greater than about 100 nm or greater than about 300 nm.

In addition, a thermal management coating described herein can be disposed on any surface of any electronic component not inconsistent with the objectives of the present disclosure. For example, in some instances, the surface is a heat-generating surface of the electronic component. Additionally, in some cases, an electronic component comprises an integrated circuit, transformer, resistor, capacitor, inductor, or an electrical connection to, from, or between electronic components. In some implementations, an electronic component comprises a circuit board such as a printed circuit board, which may include one or more electronic connections or connectors. Moreover, an electronic component can comprise or be formed from any material not inconsistent with the objectives of the present disclosure. For example, in some implementations, an electronic component comprises or is formed from a laminate such as a copper-clad laminate, a resin impregnated B-stage cloth, an epoxy, a liquid photoimageable solder mask ink, and/or a dry film photoimageable solder mask. In some implementations, an electronic component comprises or is formed from a semiconductor material such as Si, Ge, or InP; a metal such as stainless steel, gold, silver, or cooper; and/or a dielectric material such as sapphire, $SiO_2$, and SiC. Other materials may also be used.

A thermally managed electronic component described herein, in some cases, further comprises an electrically insulating material layer disposed between the graphene coating layer and the surface of the electronic component. Any insulating material layer not inconsistent with the objectives of the present disclosure may be used. In some cases, for instance, an insulating material layer comprises or is formed from a polymeric material such as a plastic or rubber material. In other cases, an insulating material layer comprises or is formed from bi-layer graphene (BLG) or graphene oxide. In some implementations, an insulating material layer comprises or is formed from an inorganic material such as silicon dioxide or a ceramic. Other electrically insulating materials may also be used.

Moreover, an insulating material layer described herein can have any thickness not inconsistent with the objectives of the present disclosure. In some implementations, for example, an insulating material layer has an average thickness of about 10 μm or less or about 1 μm or less. In some implementations, an insulating material layer has an average thickness of about 500 nm or less. In some implementations, an insulating material layer has an average thickness between about 100 nm and about 10 μm, between about 500 nm and about 10 μm, or between about 100 nm and about 1 μm. In some implementations, an electrically insulating material layer may have an average thickness greater than about 10 μm.

Further, a thermally managed electronic component described herein, in some implementations, can exhibit one or more desired properties. In some implementations, for instance, a thermal management layer of a thermally managed electronic component described herein exhibits a low weight or mass relative to the overall weight or mass of the thermally managed electronic component. For example, in some instances, a thermal management coating forms no more than about 0.3 weight percent, no more than about 0.2 weight percent, no more than about 0.1 weight percent, no more than about 0.05 weight percent, or no more than about 0.01 weight percent of the thermally managed electronic component, based on the total weight of the thermally managed electronic component. In some cases, a thermal management coating forms between about 0.001 weight percent and about 0.3 weight percent, between about 0.001 weight percent and about 0.1 weight percent, between about 0.001 weight percent and about 0.01 weight percent, or between about 0.005 weight percent and about 0.05 weight percent of the thermally managed electronic component, based on the total weight of the thermally managed electronic component. In some instances, a thermal management coating forms less than about 0.001 weight percent or more than about 0.3 weight percent of the thermally managed electronic component, based on the total weight of the thermally managed electronic component.

Additionally, in some implementations, a thermal management coating of a thermally managed electronic component described herein exhibits high thermal conductance. For example, in some cases, a thermal management coating exhibits a thermal conductance of at least about 10 $MW/m^2K$, at least about 15 $MW/m^2K$, at least about 20 $MW/m^2K$, at least about 25 $MW/m^2K$, at least about 30 $MW/m^2K$, or at least about 35 $MW/m^2K$. In some implementations, a thermal management coating of a thermally managed electronic component described herein exhibits a thermal conductance between about 10 $MW/m^2K$ and about 50 $MW/m^2K$, between about 15 $MW/m^2K$ and about 50 $MW/m^2K$, between about 20 $MW/m^2K$ and about 50 $MW/m^2K$, between about 25 $MW/m^2K$ and about 50 $MW/m^2K$, between about 25 $MW/m^2K$ and about 45 $MW/m^2K$, between about 25 $MW/m^2K$ and about 40 $MW/m^2K$, or between about 25 $MW/m^2K$ and about 30 $MW/m^2K$. In some implementations, a thermal management coating of a thermally managed electronic component described herein displays a thermal conductance between about 30 $MW/m^2K$ and 50 $MW/m^2K$. Further, in some cases, a thermal management coating described herein exhibits a thermal conductance described herein in a direction within the lateral (x, y) plane of the coating, as opposed to in the vertical (z) direction. In some implementations, a thermal management coating described herein exhibits a thermal conductance described herein in any arbitrary direction or in a plurality of directions within the lateral plane. Moreover, a thermal conductance described herein can be measured in any manner not inconsistent with the objectives of the present disclosure. For example, in some implementations, the thermal conductance is measured by a pulse photothermal reflectance (PPR) technique, such as that described in Li et al., "Heat Conduction across Multiwalled Carbon Nanotube/Graphene Hybrid Films," IEEE 2011 13th Electronics Packaging Technology Conference, pages 63-66.

Further, in some implementations, a thermally managed electronic component described herein can exhibit a combination of properties described herein. A thermally managed component described herein can exhibit any combination of properties and features not inconsistent with the objectives of the present disclosure. For example, in some implementations, a thermally managed electronic component has one or more of the following features:

(1) a graphene coating layer having an adhesion energy of at least about 75 mJ/m$^2$ or at least about 100 mJ/m$^2$, (2) a graphene coating layer thickness of less than about 30 atomic layers or less than about 10 atomic layers, (3) a thermal management layer having a weight percent relative to the total weight of the thermally managed electronic component of less than about 0.3 weight percent, and (4) a thermal management layer having a thermal conductance of greater than about 25 MW/m$^2$K.

II. Methods of Applying a Thermal Management Coating

In yet another aspect, methods of applying a thermal management coating to an electronic component are described herein. In some implementations, a method of applying a thermal management coating comprises disposing a graphene coating layer on a surface of an electronic component. In some implementations, the graphene coating layer comprises a layer of aligned carbon nanoparticles. In addition, in some cases, the method further comprises disposing an additional layer of aligned carbon nanoparticles on the graphene coating layer. Moreover, in some cases, a method described herein further comprises disposing a layer of electrically insulating material on the surface of the electronic component, wherein the layer of insulating material is positioned between the surface and the graphene coating layer.

Turning now to specific steps of methods, methods of applying a thermal management coating comprise disposing a graphene coating layer on a surface of an electronic component. The graphene coating layer can be disposed on the surface of the electronic component in any manner not inconsistent with the objectives of the present disclosure. In some implementations, for example, disposing a graphene layer is carried out using vapor deposition. Vapor deposition, in some implementations, comprises chemical vapor deposition (CVD). For example, in some implementations, CVD can be used to provide a graphene coating layer comprising one or more graphene sheets. Any CVD method not inconsistent with the objectives of the present disclosure may be used. For example, in some implementations, one or more of atmospheric pressure CVD, ultrahigh vacuum CVD, or hot filament (or hot wire or catalytic) CVD can be used. In some implementations, a CVD method comprises disposing a graphene layer from one or more carbon-containing gas-phase reactants. In some implementations, a gas-phase reactant comprises a hydrocarbon. In some implementations, a gas-phase reactant comprises benzene, ethane, methane, or a combination or mixture thereof. Further, in some implementations, a gas-phase reactant is provided in a carrier gas such as H$_2$.

In other implementations, disposing a graphene coating layer is carried out using catalytic vapor phase deposition. For instance, in some implementations, catalytic vapor deposition can be used to provide a graphene coating layer comprising a layer of graphene tubes having a vertical or substantially vertical orientation described herein. Any catalytic vapor phase deposition method not inconsistent with the objectives of the present disclosure may be used. In some implementations, a catalytic vapor phase deposition method comprises disposing metal catalyst particles on a surface of an electronic component. The metal catalyst particles, in some implementations, can be disposed on the electronic component in an array, such as an ordered array of equally spaced particles. Further, the metal catalyst particles can have any size and chemical composition not inconsistent with the objectives of the present disclosure. Moreover, the size of the metal catalyst particles, in some implementations, is selected to obtain a desired graphene tube diameter. In some implementations, for example, the metal catalyst particles have an average diameter ranging from about 1 nm to about 20 nm or about 1 nm to about 10 nm. In some implementations, the metal catalyst particles have an average diameter of less than about 1 nm. Further, in some implementations, the metal catalyst particles comprise one or more transition metals, including pure metals, metal alloys, or mixtures of metals. In some implementations, the metal catalyst particles comprise nickel, cobalt, iron, or a combination thereof. In other implementations, the metal catalyst particles comprise a noble metal such as gold or silver.

In addition, in some implementations, a catalytic vapor phase deposition method described herein further comprises disposing the electronic component in a vacuum chamber and heating the electronic component. An electronic component comprising a layer of metal catalyst particles can be heated in the vacuum chamber to any temperature not inconsistent with the objectives of the present disclosure. In some implementations, the electronic component is heated to a temperature between about 600° C. and about 800° C. In some implementations, the electronic component is heated to a temperature of about 700° C.

In some implementations, a catalytic vapor phase deposition method further comprises introducing one or more gases into the vacuum chamber, wherein at least one gas comprises a carbon-containing species. In some implementations, a carbon-containing gas such as acetylene or ethylene is introduced with a process gas such as ammonia or nitrogen. In this manner, in some implementations, a layer of graphene tubes can be grown on the metal catalyst particles disposed on the electronic component.

Further, in some implementations, a graphene layer is formed by disposing a plurality of graphene platelets on the surface and connecting the platelets to one another with one or more micro-wires. The plurality of graphene platelets can be formed by any graphene formation technique not inconsistent with connection by micro-wiring techniques. For example, in some implementations, graphene platelets are comprised of pre-fabricated graphene sheets. Further, connection of the graphene platelets by micro-wires can be performed by any micro-wiring technique not inconsistent with the objectives of the present disclosure.

In some implementations, connecting the plurality of graphene platelets is carried out by a dielectrophoretic method. For example, an electronic component with graphene platelets disposed on a surface can be subjected to dielectrophoresis with a distance between electrodes varying in any manner not inconsistent with the objectives of the present disclosure. In some implementations, for instance, the distance between electrodes can vary from about 1 µm to more than about 1 cm, depending on the desired length of microwiring. Nanoparticles formed from a material selected for specific properties such as conductivity can then be introduced into a chamber above the electrodes. In some implementations, the nanoparticles can comprise gold nanoparticles having a diameter between about 15 nm and about 30 nm. Alternating voltage can then be applied to the dielectrophoretic chamber. In some implementations, alternating voltage of about 50 V to about 250 V with a frequency of about 50 Hz to about 200 Hz can be applied to the electrodes. Applying alternating voltage can result in the formation of thin, metallic fibers. Regions of carbon-containing bodies, such as graphene platelets, can form islands on an otherwise homogeneous substrate, causing micro-wire growth in the direction of the platelets and connecting the platelets to both electrodes. In some implementations, micro-wires may be formed by a dielectrophoretic assembly process described in Hermanson et al. "Dielectrophoretic Assembly of Electrically Functional Microwires from Nanoparticle Suspensions," *Science*, vol. 294 (5544), pages 1082-1086 (2001).

In other implementations, disposing a graphene layer is carried out using thermal carburization. Any thermal carburization method not inconsistent with the objectives of the present disclosure can be used. In some implementations, a thermal carburization method comprises heating a carbon-containing substrate or electronic component described herein, such as a SiC or carbon steel substrate or component, to a high temperature under ultrahigh vacuum or inert atmosphere. Further, in some cases, a thermal carburization method comprises heating a substrate or electronic component described herein to a high temperature in a carbon-containing atmosphere. A high temperature, in some instances, comprises a temperature greater than about 1000° C. In some implementations, a high temperature can be greater than about 800° C. or greater than about 900° C. Not intending to be bound by theory, it is believed that non-carbon substrate atoms can desorb from the surface during a thermal carburization method described herein, leaving behind a carbon-rich surface. In some implementations, thermal carburization can be carried out in a manner consistent with the methods set forth in Van Bommel et al. "LEED and Auger electron observations of the SiC (0001) surface," *Surface Science,* 48(2), pages 463-472 (1975); or Gullapalli et al. "Graphene Growth via Carburization of Stainless Steel and Application in Energy Storage," *Small,* 12, pages 1697-1700 (2011).

For example, in some implementations, disposing a graphene layer can comprise disposing electronic subcomponents on a carbon-containing substrate, followed by annealing the substrate at a temperature greater than about 1000° C. With increased temperature and time, non-carbon atoms in the substrate can desorb, leaving a carbon-rich coating over the substrate and electronic subcomponents. In some implementations, the carbon-rich coating is a graphene layer disposed on the electronic component. Further, in some implementations, disposing a graphene layer can comprise disposing electronic subcomponents on a non-carbon containing substrate. The substrate and electronic subcomponents can then be disposed in a high temperature environment containing a carbon rich atmosphere. In some implementations, the high temperature can be about 950° C. Further, in some implementations, the carbon rich atmosphere can comprise hexane or another hydrocarbon. In such implementations, a graphene coating layer can be formed over the electronic subcomponents and substrate.

In other implementations, disposing a graphene layer is carried out using direct laser writing or laser scribing on a thin film of graphite oxide (GO) disposed onto the electronic component. Any direct laser writing or scribing method not inconsistent with the objectives of the present disclosure can be used. In some implementations, a direct laser writing or scribing method comprises the direct laser irradiation of a graphite oxide (GO) film under ambient conditions for reducing and patterning graphene films in a solid state. Further, varying the laser intensity and laser irradiation treatments can tune the electrical properties of the resulting laser scribed graphene (LSG). Moreover, by varying the laser intensity, laser frequency, laser pulsing profile, pulsing frequency, pulsing duty cycle, and/or the thickness of the graphite oxide (GO) film, a desired thickness of a graphene coating layer can be obtained. In some implementations, direct laser writing can be carried out in a manner consistent with the methods set forth in El-Kady & Kaner, "Scalable fabrication of high-power graphene micro-supercapacitors for flexible and on-chip energy storage," *Nature Communications,* 4, article number 1475, (Feb. 12, 2013); or Strong et al., "Patterning and Electronic Tuning of Laser Scribed Graphene for Flexible All-Carbon Devices," *ACS Nano,* 6(2), 1395-1403 (2012).

A graphene coating layer provided by a method described herein can have any property of a graphene coating layer described hereinabove in Section I. For instance, in some implementations, a graphene coating layer produced by a method described herein has a thickness of about 300 nm or less. Moreover, the thickness of a graphene coating layer described herein, in some implementations, can be selected by varying one or more parameters during deposition of the coating layer on an electronic component. For example, in some implementations, the thickness of the coating layer is selected by varying the deposition time, where a shorter deposition time provides a thinner coating layer. Further, a deposition time, in some implementations, can be selected using information obtained from a microbalance (such as a quartz crystal microbalance) arranged to determine the mass of material deposited on an electronic component. In some implementations, the information is obtained in real-time by providing information regarding the output of the microbalance (e.g., a measured mass change of an electronic component) to the deposition apparatus such as a chemical vapor deposition system, thereby forming a feedback loop.

Methods of applying a thermal management coating to an electronic component, in some implementations, further comprise disposing a layer of aligned carbon nanoparticles onto the graphene coating layer. The layer of aligned carbon nanoparticles can be disposed on the surface of the electronic component in any manner not inconsistent with the objectives of the present disclosure. In some implementations, for example, disposing a layer of aligned carbon nanoparticles is carried out using vapor deposition, such as a CVD method described hereinabove. In addition, the layer of aligned carbon nanoparticles can have structure and/or feature described hereinabove in Section I for a layer of aligned carbon nanoparticles.

In some cases, the layer of aligned carbon nanoparticles is formed on the surface of a graphene coating layer comprising one or more graphene sheets. In some such implementations, a catalyst film or layer of catalyst particles is deposited on the graphene coating layer prior to forming the layer of aligned carbon nanoparticles on the graphene coating layer. The catalyst film or layer of catalyst particles can then be used to grow the carbon nanoparticles, as described hereinabove for a graphene coating layer comprising a plurality of aligned graphene tubes. Thus, in some instances, disposing a layer of aligned carbon nanoparticles according to a method described herein comprises growing the carbon nanoparticles from the catalyst film or particles.

Moreover, in some implementations, a magnetic field and/or an electric field can be applied to the electronic component during growth of the aligned carbon nanoparticles. The magnetic field and/or electric field can have any strength and/or frequency and be applied in any manner not inconsistent with the objectives of the present disclosure. In some cases, an electric field is a direct current (DC) electric field. In other instances, an electric field is an alternating current (AC) field. For example, in some implementations, an applied DC electric field is constant (such that there is no frequency associated with the DC field) and has a magnitude defined as the applied voltage divided by the distance to the growth surface. Applied voltages, in some cases, range between about 1 Volt (V) and about 100 V, and distances range between about 1 cm and about 10 cm. Thus, in some implementations, the magnitude of a DC electric field can range between about 1 V/cm and about 100 V/cm.

The application of a field described herein, in some cases, can provide a layer having a desired structure, such as a symmetric, anti-symmetric, dextral, or sinistral structure described hereinabove. In some implementations, for instance, a layer having an anti-symmetric structure can be formed in a CVD process by applying an AC field having a frequency above the plasma frequency of the carbon-containing gas used to form the aligned carbon nanoparticles. For example, in some implementations, an applied AC electric field can have a frequency between about $10^{15}$ Hz and about $10^{17}$ Hz and a magnitude defined as the applied voltage divided by the distance to the growth surface. Applied voltages, in some cases, range between about 1 V and about 100 V, and distances range between about 1 cm and about 100 cm. Thus, in some implementations, the magnitude of an AC electric field can range between about 1 V/cm and about 100 V/cm.

In other exemplary implementations, a layer having a dextral or sinistral structure can be formed in a CVD process by applying both a DC electric field described herein and a magnetic field during growth of the aligned carbon nanoparticles. In some cases, the magnetic field is applied parallel to the applied electric field to provide a layer having a dextral structure. In other cases, the magnetic field is applied anti-parallel to the applied electric field to provide a layer having a sinistral structure. In some such cases, the applied magnetic field can have a magnitude between about 1 Gauss (G) and about 100 G.

Moreover, in some cases, a method described herein further comprises disposing a layer of electrically insulating material on the surface of the electronic component, wherein the layer of insulating material is positioned between the surface and the graphene coating layer. The layer of electrically insulating material can be disposed on the surface of the electronic component in any manner not inconsistent with the objectives of the present disclosure. In some cases, for instance, an electrically insulating layer is formed by dip coating or spray coating. Further, an insulating material layer provided by a method described herein can have any property of an insulating material layer described hereinabove in Section I.

Some implementations described herein are further illustrated in the following non-limiting examples.

Example 1

Thermally Managed Electronic Component

A thermally managed electronic component is prepared as follows. A graphene coating layer comprising a flat planar graphene sheet is applied to a surface of a cleaned electronic component by disposing the electronic component in a CVD chamber and exposing the electronic component to CVD deposition conditions. Specifically, the deposition is carried out at 500° C. for approximately 100 minutes in an atmosphere of 100 Torr partial pressure benzene, ethane or methane and 1 Torr partial pressure $H_2$, at a total pressure of approximately 101 Torr. The thickness of the resulting graphene coating layer is approximately 100 nm. As described hereinabove, a thinner graphene coating layer can be obtained by reducing the deposition time, and a thicker graphene coating layer can be obtained by increasing the deposition time. Further, the deposition time can be selected using information obtained from a microbalance disposed in the chamber and arranged to determine the mass of material deposited on the electronic component as described hereinabove.

After disposing the graphene coating layer, a 65 nm nickel film is disposed on the graphene coating layer as a catalyst. Plasma-enhanced CVD (PECVD) is carried out using acetylene as the carbon source and ammonia as the plasma enhancer for growth promotion. Specifically, the deposition is carried out at the growth conditions listed in Table 1 (where SCCM refers to standard cubic centimeters per minute, A refers to amps, V refers to volts, and W refers to watts). The resulting layer of aligned carbon nanotubes has a symmetric structure.

TABLE 1

| Temperature Range (° C.) | $C_2H_2$ (SCCM) | $NH_3$ (SCCM) | Filament current (A) | Plasma Intensity (A/V/W) | Growth Time (min.) |
|---|---|---|---|---|---|
| 600-800 | 40 | 160 | 7.2 | 0.13/650/90 | 14 |

Example 2

Thermally Managed Electronic Component

A thermally managed electronic component is prepared as follows. A graphene coating layer is disposed on an electronic component by the method set forth in Example 1. A layer of aligned carbon nanoparticles is then disposed by the method set forth in Example 1, with the addition of a DC electric field having a magnitude of about 100 V/cm during the growth of the layer of aligned carbon nanoparticles. The resulting layer of aligned carbon nanoparticles has a symmetric structure.

Example 3

Thermally Managed Electronic Component

A thermally managed electronic component is prepared as follows. A graphene coating layer is disposed on an electronic component by the method set forth in Example 1. The layer of aligned carbon nanoparticles is then disposed by the method set forth in Example 1, with the addition of an AC electric field having a frequency of about $10^{15}$ Hz and a magnitude of about 100 V/cm during the growth of the layer of aligned carbon nanoparticles. The resulting layer of aligned carbon nanoparticles has an anti-symmetric structure.

Example 4

Thermally Managed Electronic Component

A thermally managed electronic component is prepared as follows. A graphene coating layer is disposed on an electronic component by the method set forth in Example 1. The layer of aligned carbon nanoparticles is then disposed by the method set forth in Example 2, with the addition of a magnetic field parallel to the DC electric field, resulting in a net chirality to the nanomaterial growth and leading to a layer of carbon nanotubes having a dextral structure. The magnetic field has a magnitude of about 100 G.

Example 5

Thermally Managed Electronic Component

A thermally managed electronic component is prepared as follows. A graphene coating layer is disposed on an electronic component by the method set forth in Example 1. The layer of aligned carbon nanoparticles is then disposed by the method set forth in Example 4, with the modification that the magnetic field is aligned anti-parallel to the applied electric field. In this manner, a layer having a sinistral structure is provided.

Various implementations of the disclosure have been described in fulfillment of the various objectives of the disclosure. It should be recognized that these implementations are merely illustrative of the principles of the present disclosure. Numerous modifications and adaptations thereof will be readily apparent to those skilled in the art without departing from the spirit and scope of the disclosure.

That which is claimed is:

1. A thermally managed electronic component comprising:
a thermal management coating disposed on a surface of an electronic component, wherein the thermal management coating consists essentially of:
an electrically insulating material layer disposed on the surface of the electronic component; and
a graphene coating layer disposed on the electrically insulating material layer, the graphene coating layer having a thickness of 10 nm to 500 nm, wherein the graphene coating layer consists essentially of aligned carbon nanoparticles.

2. The thermally managed electronic component of claim 1, wherein the carbon nanoparticles comprise single-walled carbon nanotubes, multi-walled carbon nanotubes, fullerenes, heterofullerenes, or a combination thereof.

3. The thermally managed electronic component of claim 1, wherein the aligned carbon nanoparticles have a symmetric structure.

4. The thermally managed electronic component of claim 1, wherein the aligned carbon nanoparticles have an anti-symmetric structure.

5. The thermally managed electronic component of claim 4, wherein the aligned carbon nanoparticles have a dextral or sinistral structure.

6. The thermally managed electronic component of claim 1, wherein the thermal management coating forms no more than about 0.2 weight percent of the thermally managed electronic component, based on a total weight of the thermally managed electronic component.

7. The thermally managed electronic component of claim 1, wherein the thermal management coating exhibits a thermal conductance of greater than about 25 $MW/m^2K$.

8. The thermally managed electronic component of claim 1, further comprising a catalyst film disposed on the graphene coating layer, wherein the catalyst film comprises particles of nickel, cobalt, iron, or a combination thereof.

9. The thermally managed electronic component of claim 1, wherein the electronic component is selected from the group consisting of: a transformer, a resistor, a capacitor, and an inductor.

10. A thermally managed electronic component comprising:
a thermal management coating disposed on a surface of an electronic component, wherein the thermal management coating comprises:
a graphene coating layer disposed on the surface of the electronic component; and
at least two layers of aligned carbon nanoparticles, both disposed on a surface of the graphene coating layer opposite to the electronic component,
wherein the thermal management coating forms no more than about 0.2 weight percent of the thermally managed electronic component, based on a total weight of the thermally managed electronic component.

11. A thermally managed electronic component comprising:
a thermal management coating disposed on a surface of the electronic component, wherein the thermal management coating comprises:
a graphene coating layer disposed on the surface of an electronic component; and
a layer of aligned carbon nanoparticles, wherein at least 70 percent of the carbon nanoparticles of the layer of aligned carbon nanoparticles have a dextral structure or at least 70 percent of the carbon nanoparticles of the layer of aligned carbon nanoparticles have a sinistral structure.

12. A method of applying a thermal management coating on a surface of an electronic component, the method comprising:
disposing an electrically insulating material layer on the surface of the electronic component; and
disposing a graphene coating layer having a thickness of 10 nm to 500 nm on the electrically insulating material layer, wherein the graphene coating layer consists essentially of aligned carbon nanoparticles.

13. The method of claim 12, wherein the carbon nanoparticles comprise single-walled carbon nanotubes, multi-walled carbon nanotubes, fullerenes, heterofullerenes, or a combination thereof.

14. The method of claim 12, wherein disposing the aligned carbon nanoparticles is carried out using chemical vapor deposition.

15. The method of claim 12, further comprising disposing a catalyst film on the graphene coating layer.

16. The method of claim 15, wherein the catalyst film comprises particles of nickel, cobalt, iron, or a combination thereof.

17. The method of claim 15, further comprising growing the carbon nanoparticles from the catalyst film.

18. The method of claim 15, wherein a DC electric field or an AC electric field is applied to the electronic component during the growing of the carbon nanoparticles.

19. The method of claim 18, wherein a magnetic field is applied to the electronic component during the growing of the carbon nanoparticles.

* * * * *